United States Patent [19]

Miki

[11] Patent Number: 4,538,266

[45] Date of Patent: Aug. 27, 1985

[54] DIAGNOSTIC APPARATUS FOR DIGITAL-TO-ANALOG CONVERTERS

[75] Inventor: Yasuhiko Miki, Tokyo, Japan

[73] Assignee: Sony/Tektronix Corporation, Tokyo, Japan

[21] Appl. No.: 484,799

[22] Filed: Apr. 14, 1983

[30] Foreign Application Priority Data

Aug. 30, 1982 [JP] Japan .................................. 57-150598

[51] Int. Cl.³ .............................................. G06F 11/00
[52] U.S. Cl. ................................. 371/15; 340/347 CC
[58] Field of Search ..................... 371/15, 25; 364/480, 364/481, 575; 340/347 CC; 324/73 AT

[56] References Cited

U.S. PATENT DOCUMENTS 4,144,578  3/1979  Mueller et al. ...................... 364/575
4,229,703  10/1980  Bustin ........................... 340/347 CC Primary Examiner—Jerry Smith
Assistant Examiner—Mark Ungerman
Attorney, Agent, or Firm—John Smith-Hill; John P. Dellett; Daniel J. Bedell

[57] ABSTRACT

An apparatus for diagnosing a plurality of digital-to-analog converters simultaneously is provided. Digital signal generation means applies digital signals to the plurality of digital-to-analog converters, and the digital signals are changed in sequence so that the analog outputs from the converters are changed symmetrically with respect to a first predetermined value. The analog outputs from the converters are combined by a resistor network, and the combined output is compared with a second predetermined value by a comparator. If the comparator's output is kept to a predetermined level regardless of changing the digital signals, the digital-to-analog converters are judged that they operate properly.

19 Claims, 4 Drawing Figures

DIAGNOSTIC APPARATUS FOR DIGITAL-TO-ANALOG CONVERTERS

BACKGROUND OF THE INVENTION

The present invention relates to an apparatus for diagnosing a plurality of digital-to-analog converters simultaneously.

Various kinds of electronic instruments employ digital-to-analog converters (hereinafter referred to as DACs) for converting digital signals to analog signals. For example, the DAC generates a threshold voltage for an input logic signal in a logic analyzer controlled by a microprocessor. It is necessary to diagnose many functions of the electronic instrument for insuring the operation thereof, and one such operation requiring diagnosis is the DAC's operation.

A conventional diagnostic apparatus for DACs includes an analog-to-digital converter and a digital comparator. The output analog signal from the DAC is reproduced as a digital signal by the analog-to-digital converter, and the reproduced digital signal is compared with the input digital signal of the DAC by the digital comparator. However, this conventional diagnostic apparatus requires an expensive analog-to-digital converter. If a plurality of DACs must be diagnosed simultaneously, the diagnostic apparatus becomes more expensive because each DAC needs a set of the analog-to-digital converter and digital comparator. In addition, it requires a long time to diagnose a plurality of DACs in sequence by using a single analog-to-digital converter and digital comparator set.

SUMMARY OF THE INVENTION

According to the present invention, a plurality of DACs can be diagnosed simultaneously by a simple diagnostic system. A digital signal generation means applies digital signals to the plurality of DACs, wherein the digital signals are changed step by step so that the analog output voltages from the DACs change symmetrically with respect to a predetermined voltage. The digital signal generation means may be a microprocessor controlled by software stored in a memory, a digital pattern generator, or a combination of a presettable down counter and a presettable up counter. The analog output voltages from the plurality of DACs are combined by a resistor network which is, for example, two resistors connected in series or three resistors with one end terminals connected in common. Since the output voltages from the DACs are symmetric with respect to the predetermined voltage if all of the DACs operate properly, the output voltage from the resistor network may be constant regardless of the change of the digital signals to the DACs. This output voltage from the resistor network is compared with another predetermined voltage, e.g., ground voltage, by a comparator. The output level from the comparator represents the diagnostic result. If the output level from the comparator level is kept to a predetermined level in all variable ranges of the digital signals to the DACs, all the DACs may be normal, i.e., all the DACs may operate properly. If not so, at least one of the DACs may be abnormal, i.e., it may break down. These determinations can be made by observing the output level from the comparator with a microprocessor, a LED, or the like.

It is, therefore, an object of the present invention to provide an improved apparatus for diagnosing a plurality of DACs simultaneously.

It is another object of the present invention to provide a diagnostic apparatus for DACs which is simple and inexpensive in construction.

It is a further object of the present invention to provide a diagnostic apparatus which diagnoses a plurality of DACs easily and simultaneously.

Other objects, advantages, and features of the present invention will become apparent to those having ordinary skill in the art from a reading of the following detailed description when taken in conjunction with the accompanying drawings.

DETAILED DESCRIPTION OF THE INVENTION

Figure 1:
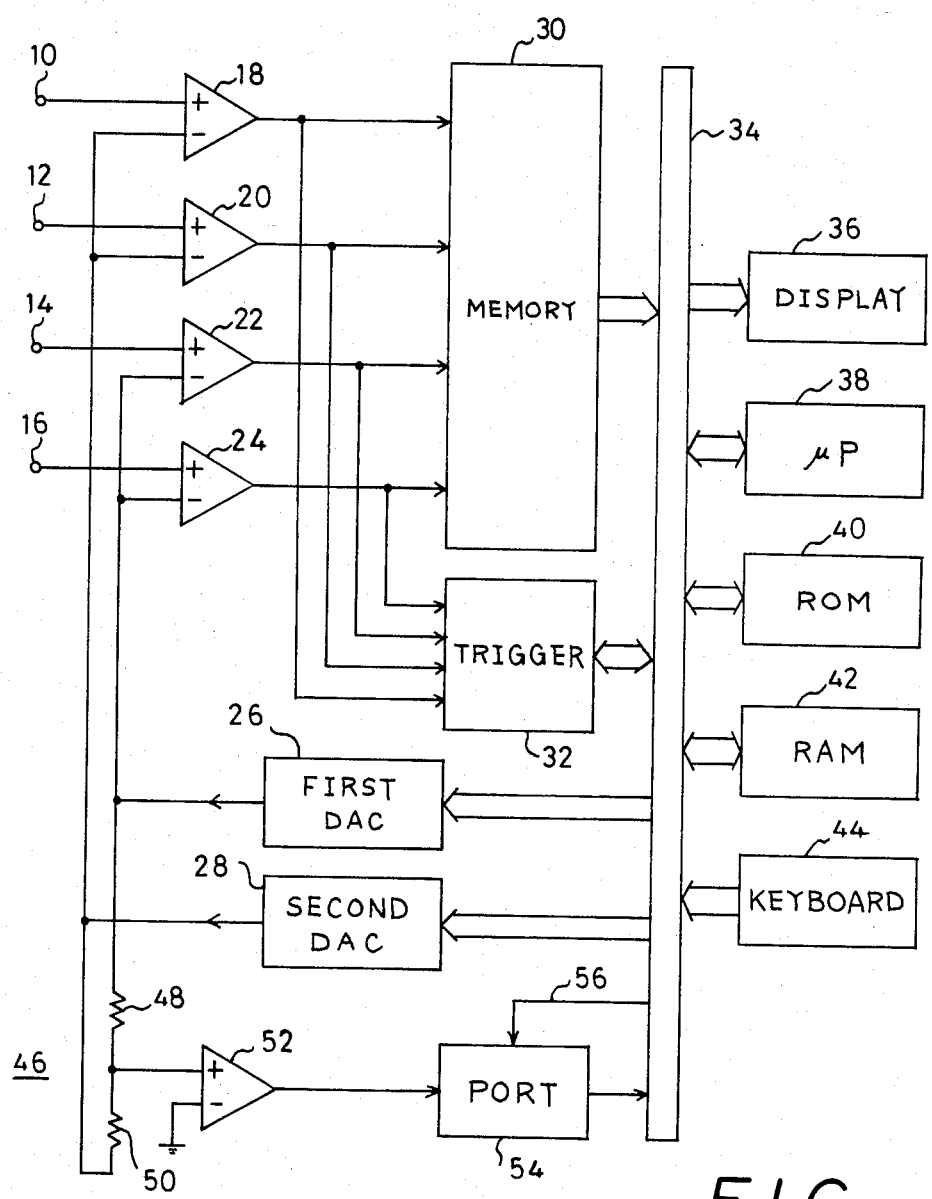
FIG. 1 illustrates a block diagram of a logic analyzer including a preferred embodiment according to the present invention.

Referring now to FIG. 1, there is shown a block diagram of a logic analyzer employing one preferred embodiment of the present invention. Logic signals at input terminals 10 through 16 are respectively compared with analog (threshold) voltages from first and second DACs 26 and 28 by comparators 18 through 24, and the logic input signals are converted to a suitable logic level (for example, ECL) for the next stage. The analog voltage from first DAC 26 is determined by reference to the logic signals at input terminals 14 and 16, and the analog voltage from second DAC 28 is determined by reference to the logic signals at input terminals 10 and 12. The output signals from comparators 18 through 24 are applied to memory circuit 30 and trigger circuit 32 for generating a trigger signal. First and second DACs 26 and 28, memory circuit 30 and trigger circuit 32 are connected to bus 34 ( including data, address and control lines) which is coupled to display device 36 such as a CRT, microprocessor ($\mu$P) 38 such as type Z80A IC, Read Only Memory (hereinafter referred to as ROM) 40 for storing programs of microprocessor 38, Random Access Memory (hereinafter referred to as RAM) 42 for acting as a temporary memory of microprocessor 38, and keyboard 44 for acting as an input device. The Z80A microprocessor is fully described in "Z80/Z80A CPU Technical Manual" and "Z8400, Z80 CPU Product Specification" published by Zilog. In response to the trigger signal from trigger circuit 32, the logic signals stored in memory circuit 30 are processed by microprocessor 38 in accordance with the program in ROM 40, and are displayed on display device 36. Keyboard 44 controls the writing mode of memory circuit 30, sets the trigger condition of trigger circuit 32, and sets the analog output voltages from first and second DACs 26 and 28 under control of the program in ROM 40 and microprocessor 38.

The diagnostic apparatus of the present invention diagnoses the operations of first and second DACs 26 and 28. For this purpose, the output terminals of first and second DACs 26 and 28 are connected to respective terminals of resistor network 46 consisting of resistors 48 and 50 having the same resistance and connected in series, and the common junction of resistors 48 and 50 is connected to the non-inverting input terminal of comparator 52 having the inverting input terminal to receive ground voltage as a first predetermined voltage. Port 54 transfers the output signal from comparator 52 to bus 34, when port 54 is enabled via control line 56. Moreover, port 54 has an additional function to convert the output logic level from comparator 52 into the logic level suitable for bus 34.

Figure 2:
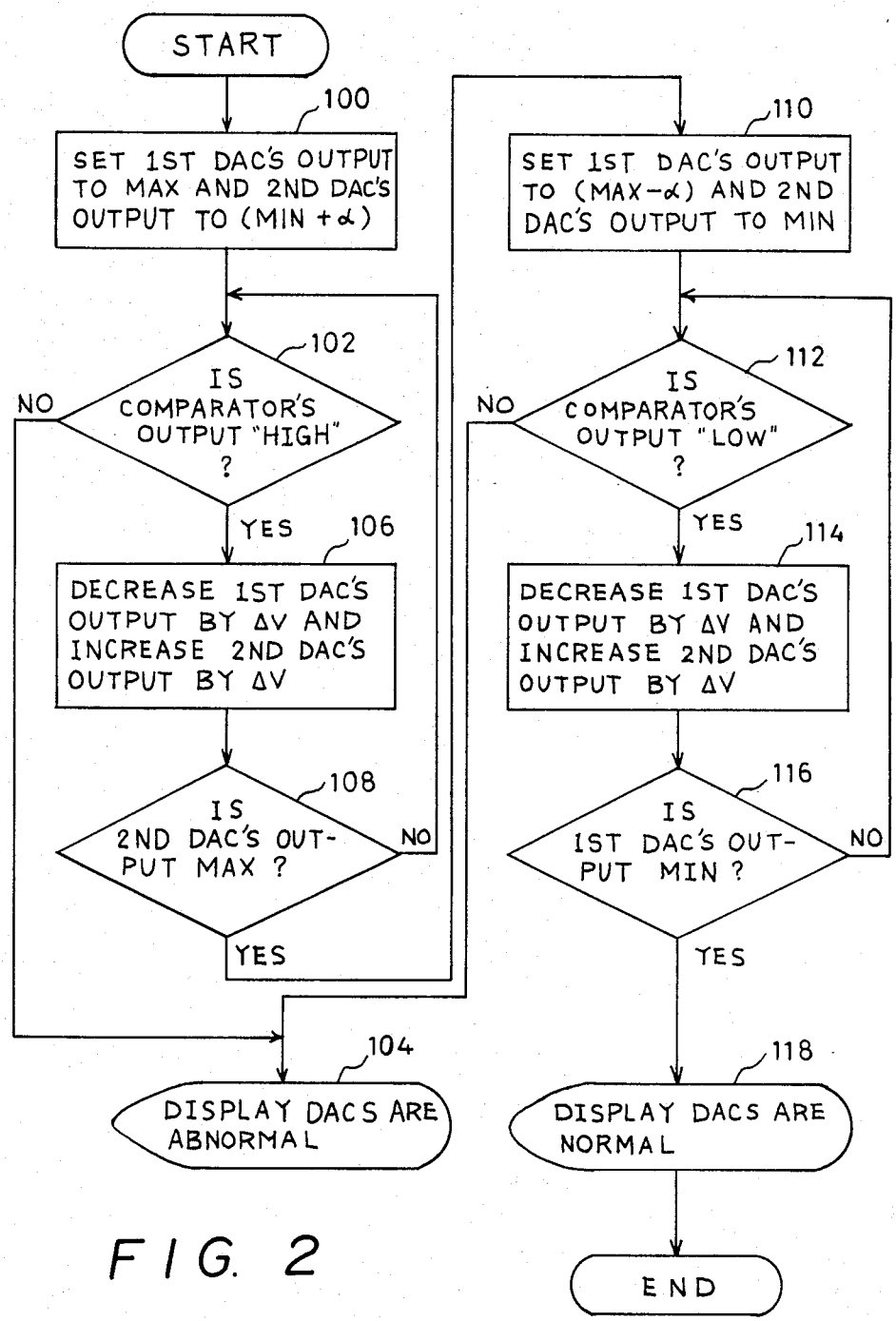
FIG. 2 illustrates a flow chart for explaining the operation of the present invention.

When a diagnostic mode for DACs 26 and 28 is selected via keyboard 44, the diagnostic apparatus of the present invention operates in accordance with a flow chart shown in FIG. 2. The operation is controlled by microprocessor 38 under control of the program in ROM 40 as follows:

STEP 100: Microprocessor 38 applies the digital signals to first and second DACs 26 and 28 in accordance with the program in ROM 40 so as to set the analog output voltage from first DAC 26 to the maximum value and the analog output voltage from second DAC 28 to a value which is the minimum value plus a predetermined value $\alpha$. The combination of microprocessor 38 and ROM 40 acts as digital signal generation means. It should be noted that the characteristics of first and second DACs 26 and 28 are equal to each other and the absolute value of the maximum value is equal to that of the minimum value in this embodiment. Assuming that the variable ranges of the analog output voltages from first and second DACs 26 and 28 are from +10.0 V to −10.0 V, one LSB (least significant bit) of the digital input signal corresponds to 0.1 V of the output voltage and the predetermined value $\alpha$ is 0.2 V corresponding to two LSBs, the analog output voltages from first and second DACs 26 and 28 are +10.0 V and −9.8 V, respectively.

STEP 102: Port 54 is enabled by the control signal from microprocessor 38, and the output signal from comparator 52 is examined by microprocessor 38. Since the value of resistor 48 is equal to that of resistor 50 as described hereinbefore, the combined voltage of resistor network 46 (voltage at the non-inverting input terminal of comparator 52) is the average value of the output voltages from first and second DACs 26 and 28. If DACs 26 and 28 are normal (they operate properly), the combined voltage is $+\alpha/2$, namely, +0.1 V. This combined voltage is compared with ground voltage (0 V) as a first predetermined voltage by comparator 52. If the output signal from comparator 52 is not "High" (i.e., if DACs 26 and 28 are not normal or at least one of them breaks down), step 104 follows. If comparator 52's output signal is "High" (i.e., if DACs 26 and 28 are normal), step 106 follows.

STEP 104: Display device 36 displays that the DACs are abnormal or at least one of them has a trouble.

STEP 106: Microprocessor 38 changes the digital signals applied to first and second DACs 26 and 28, i.e., the analog output voltage from first DAC 26 is decreased by $\Delta$ V, e.g., V, and the analog output voltage from second DAC 28 is increased by the same $\Delta$ V. Thus, first and second DACs 26 and 28 generate analog output voltages which are symmetric with respect to $+\alpha/2$ (+0.1 V) as a second predetermined voltage. The second predetermined voltage is different from the first predetermined voltage (ground voltage) in this embodiment. If the first predetermined voltage is equal to the second predetermined voltage, the two input voltages to comparator 52 become equal (if DACs 26 and 28 are normal) and the output level from comparator 52 may be astable. Thus, the difference between the first and second predetermined voltages are determined with consideration of the threshold level of comparator 52.

STEP 108: Microprocessor 38 judges whether or not the analog output voltage from second DAC 28 has reached the maximum value, i.e., whether or not the digital input signal to second DAC 28 reaches the maximum value. It should be noted that second DAC 28 reaches the maximum value before first DAC 26 reaches the minimum value because of the initial setting in step 100. In step 108, it is determined whether the operation of DACs 26 and 28 diagnosed in all the output voltage ranges. If the output voltage from second DAC 28 is not the maximum value (i.e., if the diagnostic opration has not yet been done in all the output voltage ranges), step 102 follows. If this output voltage is the maximum value (i.e., if the diagnostic operation has been done for all the output voltage ranges), step 110 follows.

STEP 110: The analog output voltage from first DAC 26 is set to a value which is the maximum value minus the predetermined value $\alpha$(0.2 V), e.g., +9.8 V, and the analog output voltage from second DAC 28 is set to the minimum value, e.g., −10.0 V. This step corresponds to the above-described step 100.

STEP 112: If the output level from comparator 52 is "Low", step 114 follows. If not so, step 104 follows. This step 112 corresponds to the above-described step 102.

STEP 114: This step 114 is the same as the aforementioned step 106, i.e., the analog output voltage from first DAC 26 is decreased by $\Delta$ V, and the analog output voltage from second DAC 28 is increased by $\Delta$ V. Thus, the analog output voltages from DACs 26 and 28 are symmetric with respect to $-\alpha/2$ (−0.1 V), if DACs 26 and 28 are normal, i.e., they operate properly.

STEP 116: The output from first DAC 26 reaches the minimum value before the output from second DAC 28 reaches the maximum value because of the setting in step 110. Thus, the output from first DAC 26 is examined to determine whether it has reached the minimum value or not. Step 118 follows if so, and step 112 follows if not so. This step 116 corresponds to the aforementioned step 108.

STEP 118: Display device 36 displays that the DACs are normal or they have no trouble.

As described hereinbefore, steps 100, 102, 106 and 108 are respectively similar to steps 110, 112, 114 and 116, however, the output voltage from resistor network 46 will be $+\alpha/2$ (+0.1 V) and $-\alpha/2$ (−0.1 V) respectively when DACs 26 and 28 are normal. If at least one of first and second DACs 26 and 28 is abnormal yet the output voltage from resistor network 46 is nevertheless always higher than the first predetermined voltage (ground voltage) in the former steps 100 through 108, the abnormal state cannot be detected in steps 100 through 108, but the abnormal state will be detected in the latter steps 110 through 116. If at least one of the DACs is abnormal yet the output voltage from resistor network 46 is always lower than the first predetermined voltage in steps 110 through 116, the abnormal condition ray be detected in the former steps 100 through 108.

Figures 3, 4:
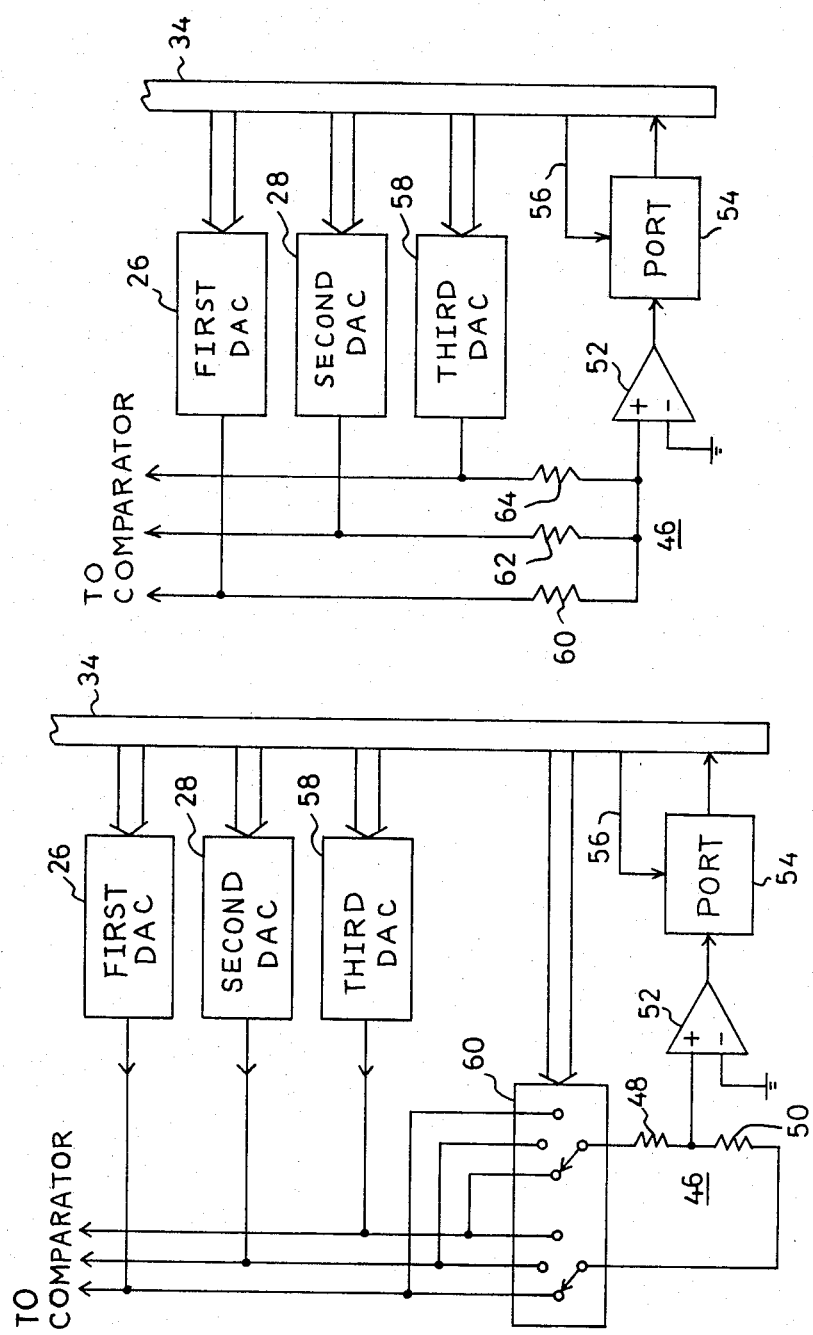
FIG. 3 illustrates a block diagram of a part of another preferred embodiment according to the present invention.
FIG. 4 illustrates a block diagram of a part of a further preferred embodiment according to the present invention.

FIG. 3 is a block diagram of a part of another preferred embodiment according to the present invention, wherein the same reference numbers have been employed to designate like blocks in FIG. 1. Of course, blocks 36 through 44 are connected to bus 34. This embodiment diagnoses three DACs. The digital input terminal of third DAC 58 is connected to bus 34, and the analog output voltage therefrom is applied to resistor network 46. Analog switch (analog multiplexer) 60 applies two analog output voltages from first through third DACs 26, 28 and 58 to both the end terminals of resistor network 46 under control of the control signal from bus 34. For example, first and second DACs 26 and 28 first are selected and diagnosed in accordance with the flow chart in FIG. 2. Then, if the diagnostic result is normal, i.e., if first and second DACs 26 and 28 operate properly, first (or second) and third DACs 26 (or 28) and 58 are selected for diagnosing them similarly. If the second diagnostic result is abnormal, third DAC 58 is determined to be abnormal. If the diagnostic result for first and second DACs 26 and 28 is abnormal, which of the two DACs 26 and 28 is abnormal is determined from the diagnostic results for the combination of first and third DACs 26 and 58 and the combination of second and third DACs 28 and 58. In other words, this embodiment can identify the abnormal DAC, if only one of the DACs breaks down.

FIG. 4 is a block diagram of a part of a further preferred embodiment according to the present invention, wherein the relationship of FIGS. 1 and 4 is the same as that of FIGS. 1 and 3. In this embodiment, resistor network 46 consists of three resistors 60, 62 and 64. The resistors each have one end terminal connected to the output terminal of one of the first, second and third DACs 26, 28 and 58 and the other end terminal connected to the non-inverting input terminal of comparator 52. In the case that the values of resistors 60, 62 and 64 are equal to each other, the analog output voltage from one of DACs 26, 28 and 58 is fixed to $+\alpha/2$ or $-\alpha/2$ (e.g., +0.1 V or -0.1 V), and the other two DACs are diagnosed in accordance with the flow chart of FIG. 2. The diagnostic operation is repeated with a different DAC having its output voltage fixed. In the case that the values of resistors 62 and 64 are twice that of resistor 60, the same digital signal is applied to second and third DACs 28 and 58 so that the combination of second and third DACs 28 and 58 acts as the second DAC, and the DACs are diagnosed in accordance with the flow chart of FIG. 2. In this instance, three DACs can be diagnosed simultaneously.

One example of actual program corresponding to steps 100 through 118 in the flow chart of FIG. 2 is shown in appendix A. This program is represented in the assembly language for the Z80A microprocessor.

As can be understood from the foregoing description, the present invention can diagnose a plurality of DACs simultaneously by a simple construction. Especially if the electronic instrument includes a microprocessor system similarly to the aforementioned embodiments, the present invention can be completed by adding a resistor network, a comparator and program. In the case that the output voltage from the resistor network is used as a threshold level for a logic input signal in a logic analyzer or the like, some circuits can be used for both the logic analyzer and the present invention.

While I have shown and described herein the preferred embodiments of my invention, it will be apparent to those skilled in the art that many changes and modifications may be made without departing from my invention in its broader aspects. For example, the resistance values of the resistor network may be different in the embodiments of FIGS. 1 and 3, so that the first and second predetermined voltages will be equal to each other. Even if there are more than three DACs, the embodiments of FIGS. 3 and 4 can diagnose them by increasing the number of the terminals of the analog switch in FIG. 3 and by increasing a number of the resistors of the resistor network in FIG. 4. The microprocessor and the ROM are used as the digital signal generation means in the embodiments, however, a combination of presettable down and up counters or a pattern generator may be used. In addition, the output of the comparator may be connected to a LED or the like for watching the diagnostic result, and the port may be eliminated by using a comparator having an enable terminal. Therefore, the scope of the present invention should be determined only by the following claims.

APPENDIX A

| LOC | INST | MNEM | OPER |
|---|---|---|---|
| BCC4 | D5 | PUSH | DE |
| BCC5 | 3A00F8 | LD | A, (F800) |
| BCC8 | B7 | OR | A |
| BCC9 | C2DBBC | JP | NZ, BCDB |
| BCCC | AF | XOR | A |
| BCCD | D301 | OUT | (01), A |
| BCCF | 2F | CPL | |
| BCD0 | D301 | OUT | (01), A |
| BCD2 | D301 | OUT | (01), A |
| BCD4 | D301 | OUT | (01), A |
| BCD6 | D301 | OUT | (01), A |
| BCD8 | C3E7BC | JP | BCE7 |
| BCDB | AF | XOR | A |
| BCDC | D303 | OUT | (03), A |
| BCDE | D303 | OUT | (03), A |
| BCE0 | 2F | CPL | |
| BCE1 | D303 | OUT | (03), A |
| BCE3 | D303 | OUT | (03), A |
| BCE5 | D303 | OUT | (03), A |
| BCE7 | 3EC0 | LD | A, C0 |
| BCE9 | D3E3 | OUT | (E3), A |
| BCEB | 3E1F | LD | A, 1F |
| LOC | INST | MNEM | OPER |
| BCED | D35A | OUT | (5A), A |
| BCEF | 018908 | LD | BC, 0889 |
| BCF2 | 1604 | LD | D, 04 |
| BCF4 | AF | XOR | A |
| BCF5 | 79 | LD | A, C |
| BCF6 | B0 | OR | B |
| BCF7 | D3E0 | OUT | (E0), A |
| BCF9 | 2F | CPL | |
| BCFA | F609 | OR | 09 |
| BCFC | D3E1 | OUT | (E1), A |
| BCFE | 212800 | LD | HL, 0028 |
| BD01 | E5 | PUSH | HL |
| BD02 | CDDCDF | CALL | DFDC |
| BD05 | F1 | POP | AF |
| BD06 | DB59 | IN | A, (59) |
| BD08 | 07 | RLCA | |
| BD09 | D24EBD | JP | NC, BD4E |
| BD0C | 15 | DEC | D |
| BD0D | 7A | LD | A, D |
| BD0E | B7 | OR | A |
| BD0F | CA18BD | JP | Z, BD18 |
| BD12 | 78 | LD | A, B |
| LOC | INST | MNEM | OPER |
| BD13 | 07 | RLCA | |
| BD14 | 47 | LD | B, A |
| BD15 | C3F4BC | JP | BCF4 |
| BD18 | 018110 | LD | BC, 1081 |
| BD1B | 1604 | LD | D, 04 |
| BD1D | 79 | LD | A, C |
| BD1E | 7A | LD | A, D |
| BD1F | FE04 | CP | 04 |
| BD21 | C229BD | JP | NZ, BD29 |
| BD24 | AF | XOR | A |
| BD25 | 79 | LD | A, C |

APPENDIX A-continued

| | | | |
|---|---|---|---|
| BD26 | C32CBD | JP | BD2C |
| BD29 | AF | XOR | A |
| BD2A | 79 | LD | A, C |
| BD2B | B0 | OR | B |
| BD2C | D3E1 | OUT | (E1), A |
| BD2E | 2F | CPL | |
| BD2F | 0F | RRCA | |
| BD30 | D3E0 | OUT | (E0), A |
| BD32 | 212800 | LD | HL, 0028 |
| BD35 | E5 | PUSH | HL |
| BD36 | CDDCDF | CALL | DFDC |
| LOC | INST | MNEM | OPER |
| BD39 | F1 | POP | AF |
| BD3A | DB59 | IN | A, (59) |
| BD3C | 07 | RLCA | |
| BD3D | DA4EBD | JP | C, BD4E |
| BD40 | 7A | LD | A, D |
| BD41 | B7 | OR | A |
| BD42 | C247BD | JP | NZ, BD47 |
| BD45 | D1 | POP | DE |
| BD46 | C9 | RET | |
| BD47 | 15 | DEC | D |
| BD48 | 78 | LD | A, B |
| BD49 | 07 | RLCA | |
| BD4A | 47 | LD | B, A |
| BD4B | C31EBD | JP | BD1E |
| BD4E | 210800 | LD | HL, 0008 |
| BD51 | E5 | PUSH | HL |
| BD52 | CD95DB | CALL | DB95 |
| BD55 | F1 | POP | AF |
| BD56 | D1 | POP | DE |
| BD57 | C9 | RET | |

I claim:

1. A diagnostic apparatus for two digital-to-analog converters, comprising:
digital signal generation means for applying digital signals to said two digital-to-analog converters respectively, said digital signals being changed in sequence so that the analog output voltages from said two digital-to-analog converters are changed symmetrically with respect to a first predetermined voltage;
a resistor network for combining said analog output voltages from said two digital-to-analog converters; and
a comparator for comparing the output voltage from said resistor network with a second predetermined voltage, the output signal from said comparator representing a diagnostic result of said two digital-to-analog converters.

2. A diagnostic apparatus according to claim 1, wherein said digital signal generation means comprises a microprocessor.

3. A diagnostic apparatus according to claim 1, wherein said digital signal generation means is a digital pattern generator.

4. A diagnostic apparatus according to claim 1, wherein said digital signal generation means includes a presettable up counter and a presettable down counter.

5. A diagnostic apparatus according to claim 1, wherein said resistor network consists of two resistors connected in series, both the end terminals of said two resistors receiving said analog output voltages from said two digital-to-analog converters, and the common junction of said two resistors being connected to one input terminal of said comparator.

6. A diagnostic apparatus according to claim 5, wherein the resistances of said two resistors are equal to each other.

7. A diagnostic apparatus according to claim 1, further including means for receiving the output signal from said comparator and determining whether at least one of said two digital-to-analog converters is faulty.

8. A diagnostic apparatus according to claim 1, further including means for receiving the output signal from said comparator and providing a visual indication as to whether at least one of said two digital-to-analog converters is faulty.

9. A method of diagnosing first and second digital-to-analog converters, comprising the steps of:
setting the analog output voltages from said first and second digital-to-analog converters to the maximum value and the minimum value plus a first predetermined value, respectively;
decreasing said analog output voltage from said first digital-to-analog converter by a second predetermined value and increasing said analog output voltage from said second digital-to-analog converter by said second predetermined value; and
comparing the average value of said analog output voltages from said first and second digital-to-analog converters with a third predetermined value until said analog output voltage from said second digital-to-analog converter reaches the maximum value, the comparison result representing the diagnostic result of said first and second digital-to-analog converters.

10. A method according to claim 9, further including the steps of:
setting said analog output voltages from said first and second digital-to-analog converters to the maximum value minus said first predetermined value and the minimum value, respectively;
decreasing said analog output voltage from said first digital-to-analog converter by said second predetermined value and increasing said analog output voltage from said second digital-to-analog converter by said second predetermined value; and
comparing the average value of said analog output voltages from said first and second digital-to-analog converters with said third predetermined value until said analog output voltage from said first digital-to-analog converter reaches the minimum value.

11. A diagnostic apparatus for more than two digital-to-analog converters, comprising:
switch means for selecting two of the digital-to-analog converters;
digital signal generation means for applying digital signals to the selected two digital-to-analog converters, said digital signals being changed in sequence such that the analog output voltages from said two digital-to-analog converters are changed symmetrically with respect to a first predetermined voltage;
a resistor network for combining the analog output voltages from the selected two digital-to-analog converters; and
a comparator for comparing the output voltage from said resistor network with a second predetermined voltage, the output signal from said comparator representing a diagnostic result of said selected digital-to-analog converters.

12. A diagnostic apparatus according to claim 11, wherein the switch means select the two selected digital-to-analog converters by connecting the outputs of the two selected digital-to-analog converters to the resistor network.

13. A diagnostic apparatus according to claim 11, wherein said digital signal generation means comprises a microprocessor.

14. A diagnostic apparatus according to claim 11, wherein said digital signal generation means is a digital pattern generator.

15. A diagnostic apparatus according to claim 11, wherein said digital generation means includes a presettable up counter and a presettable down counter.

16. A diagnostic apparatus according to claim 11, wherein said resistor network consists of two resistors connected series, both of the end terminals of said two resistors receiving respectively the two analog output voltages of the selected digital-to-analog converters, and the common junction of said two resistors being connected to one input terminal of said comparator.

17. A diagnostic apparatus according to claim 16, wherein the resistances of said two resistors are equal to each other.

18. A diagnostic apparatus for a digital-to-analog converters, where n is an integer greater than 2, comprising:
n resistors of equal resistance value and each having first and second end terminals, the first end terminals being connected together and the second end terminals receiving the analog output voltages from the n digital-to-analog converters respectively;
digital signal generation means for applying first and second digital signals to two selected digital-to-analog converters and a third digital signal to each other digital-to-analog converter, said first and second digital signals being changed in sequence such that the analog output voltages from the selected two digital-to-analog converters are changed symmetrically with respect to a first predetermined voltage, and said third digital signal being such that each other digital-to-analog converter generates said first predetermined voltage; and
a comparator for comparing the voltage at said first end terminals of the resistors with a second predetermined voltage, the output signal from said comparator representing a diagnostic result of the n digital-to-analog converters.

19. A diagnostic apparatus for n digital-to-analog converters, where n is an integer greater than 2, comprising:
a first group of m resistors, where m is an integer greater than 1 and less than n, of equal resistance value and each having first and second end terminals, the first end terminals being connected together and the second end terminals receiving the analog output voltages from m of the n digital-to-analog converters respectively;
a second group of p resistors, where $p=n-m$, of equal resistance value and each having first and second end terminals, the first end being connected to the first end terminals of the resistors of the first group and the second end terminals receiving the analog output voltages from the p digital-to-analog converters respectively that do not provide analog output voltages to the first group of resistors, the ratio of the resistance value of each resistor of the second group to the resistance value of a resistor of the first group being determined by the ratio of the value of m to the value of p;
digital signal generation means for applying first and second digital signals to the digital-to-analog converters that are connected to the first and second groups of resistors respectively, said first and second digital signals being changed in sequence such that the analog output voltages from said digital-to-analog converters are changed symmetrically with respect to a first predetermined voltage; and
a comparator for comparing the voltages at said first end terminals of the n resistors with a second predetermined voltage, the output signal from said comparator representing a diagnostic result of the n digital-to-analog converters.

* * * * *

UNITED STATES PATENT AND TRADEMARK OFFICE
CERTIFICATE OF CORRECTION

PATENT NO. : 4,538,266
DATED : August 27, 1985
INVENTOR(S) : Yasuhiko Miki

It is certified that error appears in the above-identified patent and that said Letters Patent is hereby corrected as shown below:

Column 3, line 62, "e. g., V" should be --e. g., 1V".
Column 4, line 16, "DACs 26 and 28 diagnosed" should be --DACs 26 and 28 has been diagnosed--;
line 18, "opra-" should be --opera---.
Column 6, line 8, "of the terminals" should be --of terminals--;
line 9, "a" should be --the-- and "of the" should be --of--.
Column 9, line 17, "a" should be --n--.

Signed and Sealed this

Tenth Day of December 1985

[SEAL]

Attest:

Attesting Officer

DONALD J. QUIGG

Commissioner of Patents and Trademarks